(12) United States Patent
Yeh et al.

(10) Patent No.: US 6,281,134 B1
(45) Date of Patent: Aug. 28, 2001

(54) METHOD FOR COMBINING LOGIC CIRCUIT AND CAPACITOR

(75) Inventors: Wen-Kuan Yeh, Chu-Pei; Wen-Jeng Lin, Pan-Chiao, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/425,603

(22) Filed: Oct. 22, 1999

(51) Int. Cl.[7] ................................................. H01L 21/3065
(52) U.S. Cl. ........................ 438/706; 438/710; 438/712; 438/720
(58) Field of Search .................................... 438/706, 710, 438/717, 253, 256, 240, 396, 399, 638, 637; 257/301, 302, 303, 306

(56) References Cited

U.S. PATENT DOCUMENTS

| | | | |
|---|---|---|---|
| 5,689,126 | * 11/1997 | Takaishi | 257/306 |
| 5,916,823 | * 6/1999 | Lou et al. | 438/738 |
| 6,025,226 | * 2/2000 | Gambino et al. | 438/244 |
| 6,037,216 | * 3/2000 | Liu et al. | 438/253 |

* cited by examiner

Primary Examiner—Benjamin L. Utech
Assistant Examiner—Lan Vinh

(57) ABSTRACT

A method for forming combining a logic circuit and a capacitor of a passive element is disclosed. The method includes the following steps. First, a semiconductor wafer having a first dielectric layer and a first contact is provided. A first metal layer is formed on the first contact and around an estimated area. A second dielectric layer is formed on the first metal layer and the first dielectric layer. The second dielectric layer is formed on the first metal layer and the first dielectric layer. The second metal is formed on areas of the metal layer of the estimated areas. The third dielectric layer is formed on the second metal layer and the second dielectric layer. The fourth dielectric layer is formed on the third dielectric layer. The fifth dielectric layer is formed on the fourth dielectric layer. Sequentially the fifth dielectric layer, the fourth dielectric layer, the third dielectric layer, and the second dielectric layer are all etched.

25 Claims, 8 Drawing Sheets

METHOD FOR COMBINING LOGIC CIRCUIT AND CAPACITOR

BACKGROUND OF THE INVENTION

1. Field of the Invention

The present invention relates about a method for combining logic circuit and capacitor circuit, more particularly for precisely controlling the shape and area of the inter-metal line, increasing capacitor and reducing electrical resistance.

2. Description of the Prior Art

Currently, demand for integrated circuit (I.C.) has rapidly increased due to widespread use of electronic equipment. In particular, the increasing popularity of some electronic equipment such as, for example, many kinds of computers are gradually increasing the demand for the large or very large semiconductor memories in this modern century and next coming twenty-one century. Therefore, the advanced manufacture technology for improvement fabrication of integrated circuit should be urgently need than before.

Normally, the size and performance of the power IC devices depends critically on a specific at a particular breakdown voltage of the output devices. Since the thickness of semiconductor is usually limited by technological constraints, higher breakdown voltages typically require more layers. However, since the device on resistance is proportional to the expitaxial layer resistivity, higher breakdown voltages have to generally be traded off for limited drive current capability.

Thus, there is a conventional method described as referring with FIG. 1A, which is the method for combining logical circuit and passive capacitor. Firstly a semiconductor wafer 10 is provided, which concludes a first oxide layer 112 of a first contact 110 upon, of course, there are element structures inside semiconductor wafer 10. Then, a first metal layer 114 and 116 is deposited respectively on the first contact 110 and around estimated position. The first metal layer 114 is located in logic circuit 12 and another first metal layer 116 is located in capacitor 14, as an lower electrode of capacitor shown on FIG. 1B.

Sequentially, as FIG. 1C, second oxide 118 is overlapped upon semiconductor wafer 10 and first metal layer 114 and 116. FIG. 1D shows, a second metal layer 120, as an upper electrode is deposited upon first metal layer 116 through second oxide layer 118. Then, second contact 124, third contact 126 and fourth contact 128 are formed by etching third oxide layer 122 which is upon portions of first metal layer 114 and 116 and portions of second metal layer 120, and inside second metal layer 118 and third oxide layer 122. Consequentially a tungsten layer is overlapped as a tungsten plug and etched back using the dry etching method or the chemical mechanical polishing (CMP) method, shown as FIG. 1E.

Finally, aluminium metal layer 130 is deposited and overlapped on second contact 124, third contact 126, fourth contact 128, third oxide layer 122 and semiconductor wafer 10. Then this aluminium metal layer 130 is etched as a metal via, referring with FIG. 1F. Then logic circuit 12 and capacitor 14 can be connected through outer line.

From the prior art, the disadvantages of manufacture process for combining logic circuit and capacitor circuit are the following:

1. The size of aluminium metal line is difficult to be controlled very well in the nano-size for the manufacture of semiconductor. It also will reduce the performance and reliability of semiconductor elements.
2. The value of capacitor will be reduced in the semiconductor elements.
3. The resistance of aluminium metal line is not satisfied the requirement of semiconductor elements.

SUMMARY OF THE INVENTION

In accordance with the present invention, a method is provided for manufacturing the logic circuit and the capacitor circuit that substantially solving the conventional process problem and producing the purpose semiconductor.

In one embodiment, the method for combining logic circuit and capacitor circuit, normally concludes the following steps. First of all, a semiconductor wafer is provided. Also, the semiconductor wafer owns a first dielectric layer and a first contact formed on the semiconductor wafer. The first metal layer is formed on the first contact and around a estimated area. The first metal layer of the first contact is located on the estimated logical circuit area. The first metal layer is on the estimated capacitor circuit area. The second dielectric layer is formed onto the first metal layer and the first dielectric layer. The second metal layer is formed which is on areas of the metal layer of the estimated areas. The second electric layer abuts on areas of the second dielectric layer. The third dielectric layer is formed on the second metal layer and the second dielectric layer. The fourth dielectric is formed on the third dielectric layer. The fifth dielectric layer is formed on the fourth dielectric layer. Sequentially the fifth dielectric layer and the fourth dielectric layer and the third dielectric layer and the second dielectric layer are all etched. The above steps can form a second contact, which is on portions of the first metal layer of estimated areas. The third contact is located on the second metal layer. The fourth contact is located on the first metal layer of the first contact. The fifth dielectric layer is etched. Here, the second contact and the third contact and the fourth contact inside the fifth dielectric layer is bigger than the second contact and the third contact and the fourth contact inside the third dielectric layer. The barrier layer is formed into the two side walls and bottom, also into the second contact and the third contact and the fourth contact. The inter-metal line is formed into the second contact and the third contact and the fourth contact. The inter-metal line is planarized. Finally, the outer connection line is formed, it can combine the logical circuit and the capacitor circuit.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed.

Figure 1A:
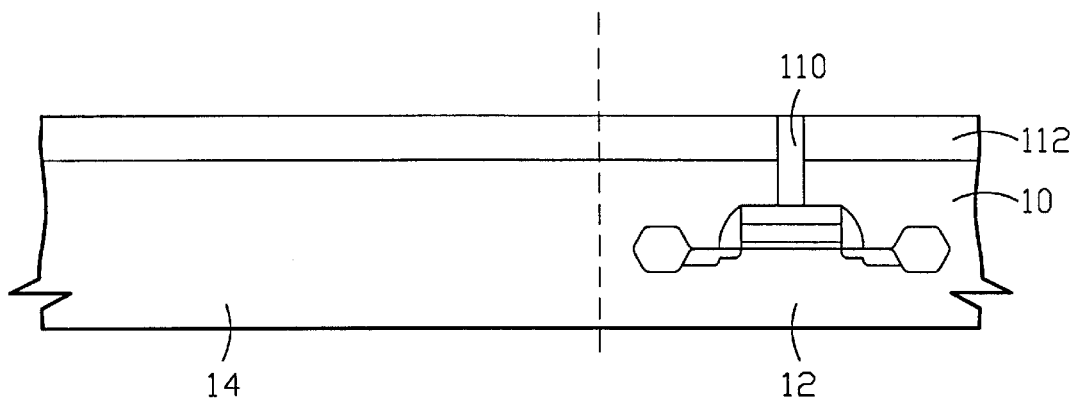
FIGS. 1A, 1B, 1C, 1D, 1E and 1F is a diagram schematically illustrating a conventional process for combining the logic circuit and the capacitor circuit.
Figure 1B:
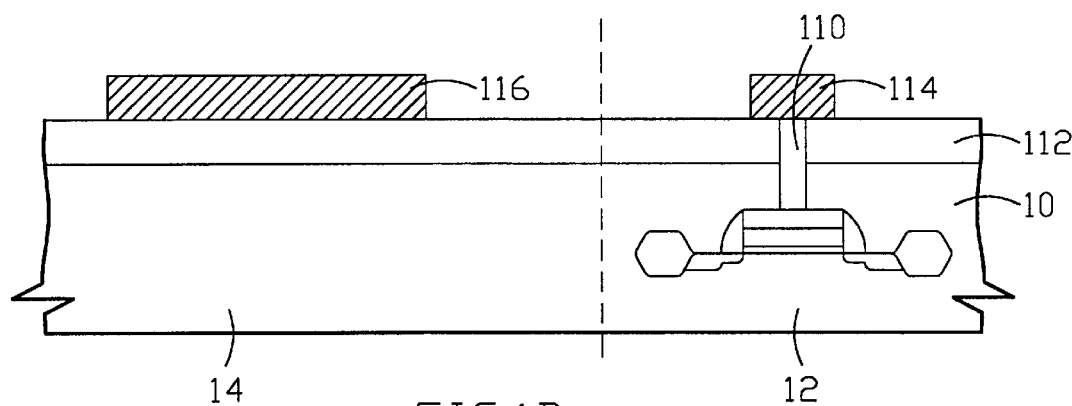
Figure 1C:
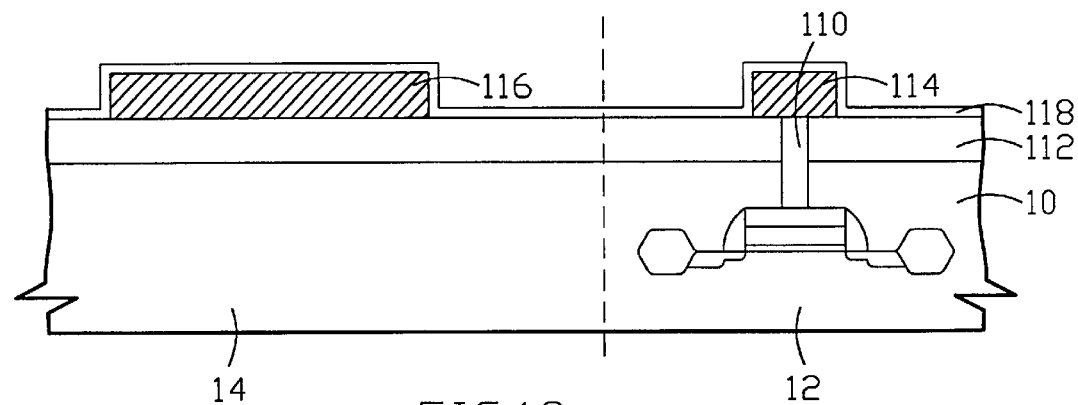
Figure 1D:
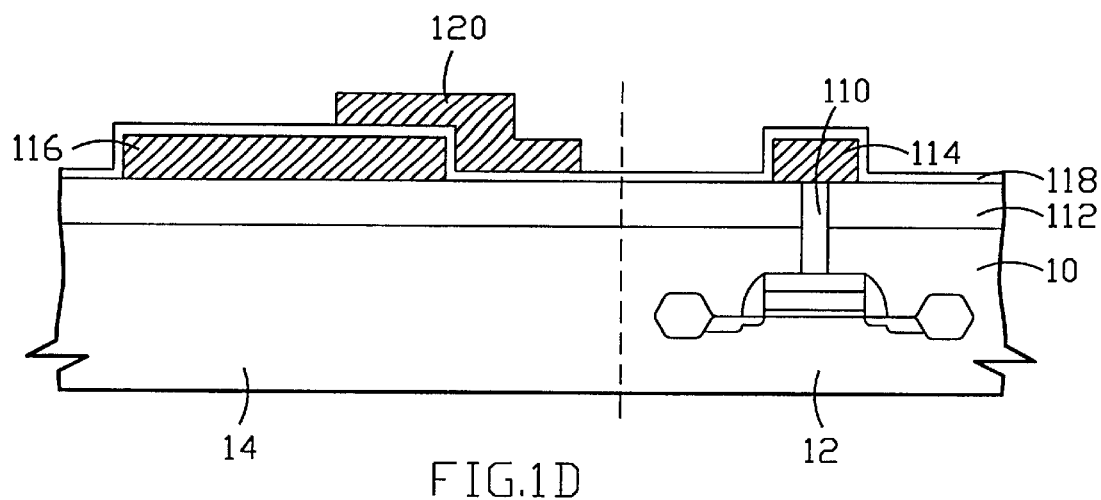
Figure 1E:
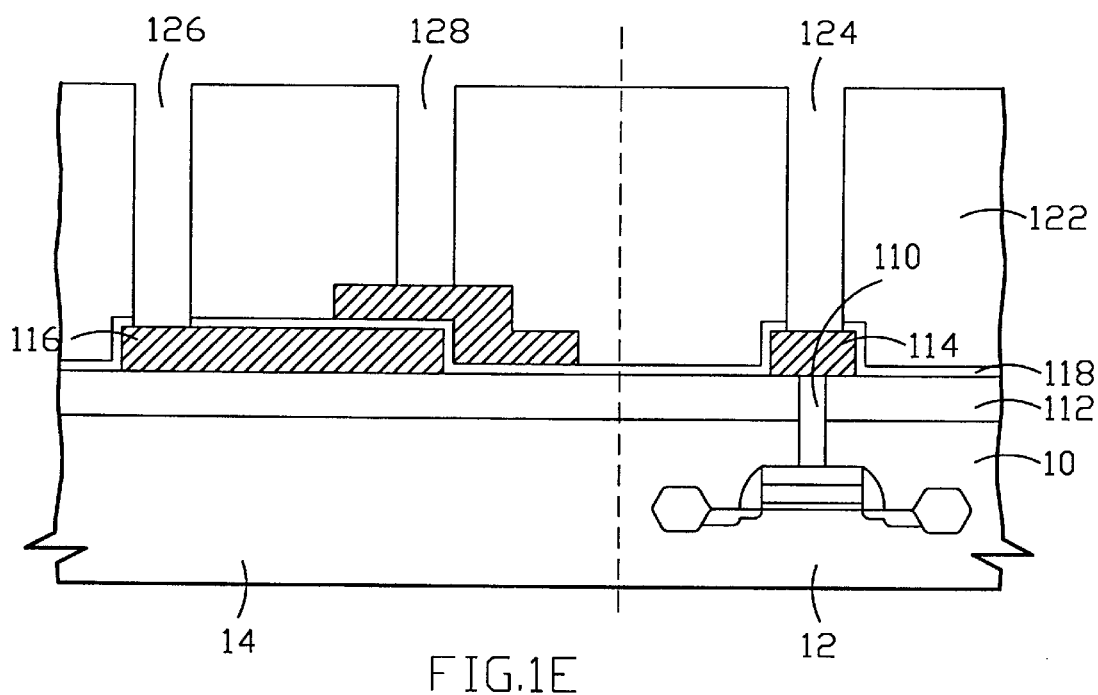
Figure 1F:
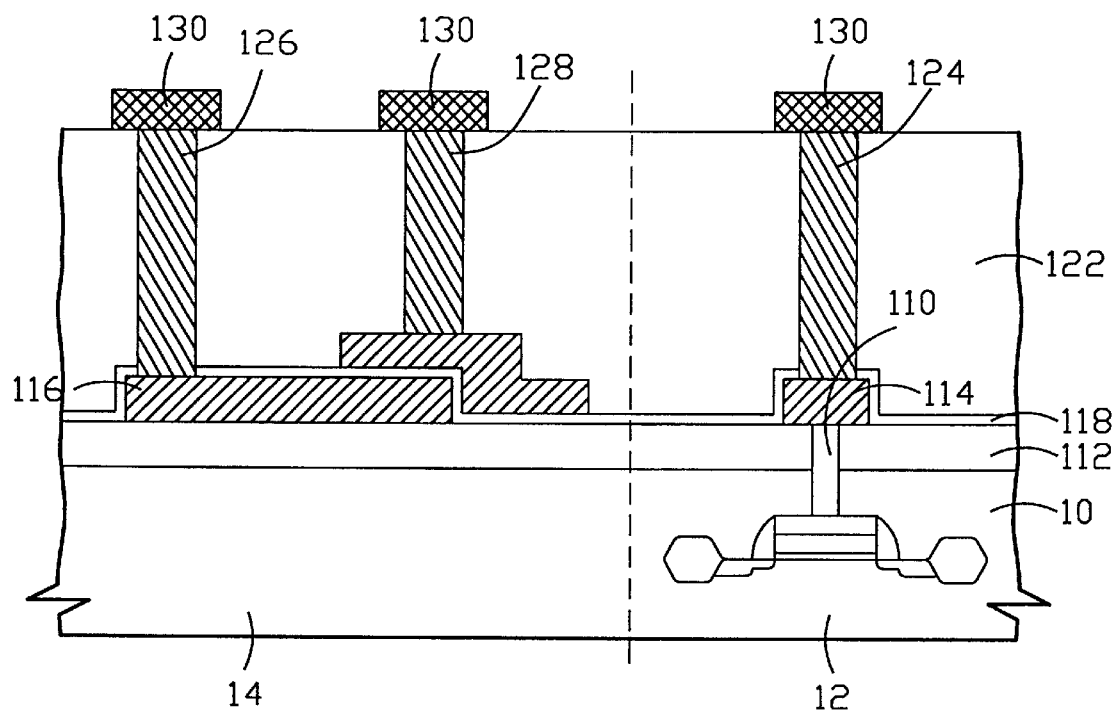
Figure 2:
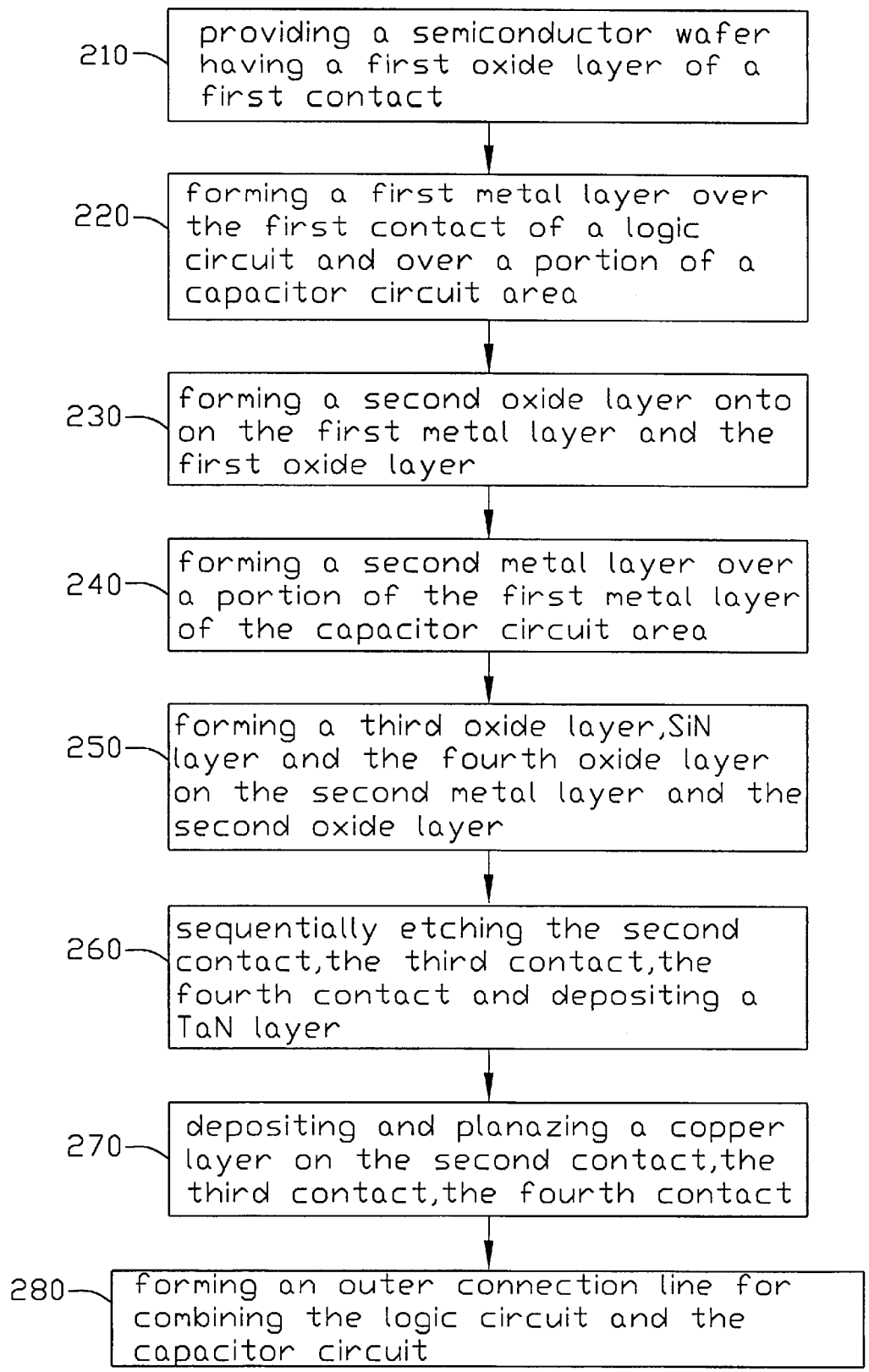
FIG. 2 is a diagram schematically illustrating an embodiment flow chart for combining the logic circuit and the capacitor circuit according to the invention.

Thus, the spirit of the proposed invention can be explained and understood by the following embodiments with corresponding figures. With reference to FIG. 2, the method according to the present invention is schematically shown to include the whole method. Firstly, step 210 shows a semiconductor wafer is provided, a first oxide layer of the first contact is formed on the semiconductor wafer. Then, in step 220, a first metal layer is deposited. Then, in step 230, a second oxide layer is overlapped on the first metal layer and the first oxide layer. Sequentially, in step 240, a second metal layer is crossed the second oxide layer and deposited on portions of first metal layer, as the upper electrode of capacitor. In step 250, a third oxide layer, silicon nitride layer and fourth oxide layer are sequentially deposited and overlapped on the second metal layer and the second oxide layer. Then, in step 260, the second contact, the third contact and the fourth contact are all etched into the second oxide layer, the third oxide layer, the silicon nitride layer and the fourth oxide layer. Also the TaN thin film is deposited on the two side walls and bottoms as the barrier layer. This TaN layer can increase the attachment capability of copper. Step 270 illustrates, the copper can be deposited on the second contact, the third contact and the fourth contact as the inter-metal line. Then, the copper metal layer can be planarized by using the chemical mechanical polishing method. Finally, in step 280, logic circuit and capacitor can be connected using outer connection line. The more description of FIG. 2 will be shown as the FIG. 3.

Figure 3A:
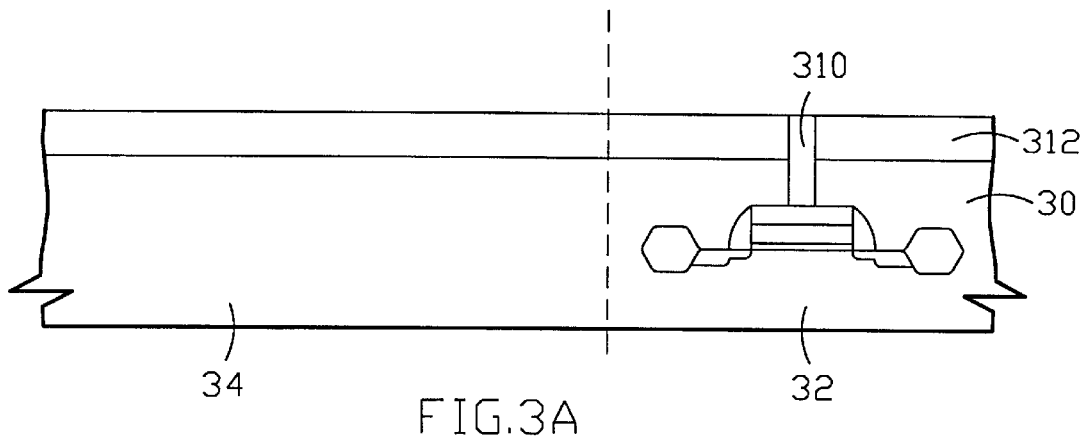
FIGS. 3A, 3B, 3C, 3D, 3E, 3F, 3G and 3H are diagrams schematically illustrating a process for combining the logic circuit and the capacitor circuit according to the present invention.
Figure 3B:
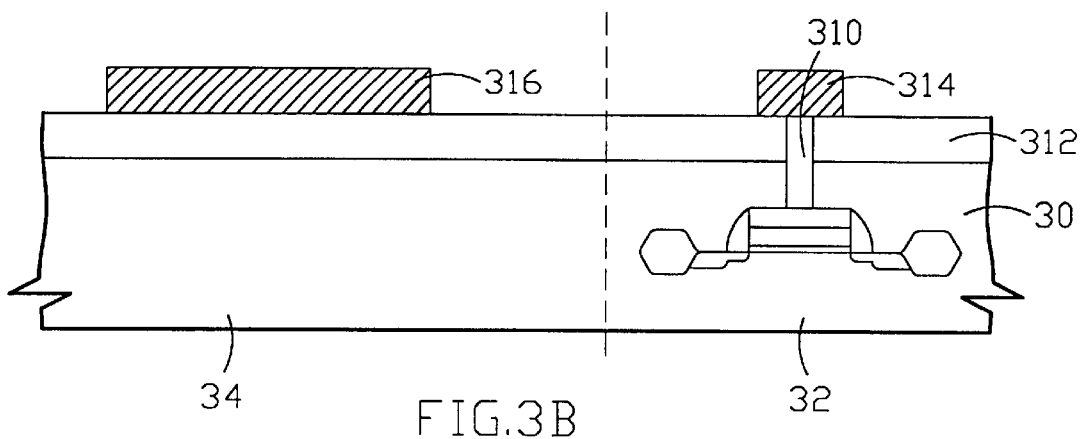

FIG. 3A illustrates, firstly, a semiconductor wafer 30 is provided. The above semiconductor wafer 30 owns a first dielectric layer 312 and a first contact 310 that are all formed on semiconductor wafer 30. Then, a first metal layer 314 and 316 is formed on first contact 310 and around a estimated area. First metal layer 314 of first contact 310 located on estimated logical circuit area 32. First metal layer 314 is on estimated capacitor circuit area 34, as the lower electrode of the capacitor. The purpose material for above first metal layer could be aluminium metal, as FIG. 3B.

Figure 3C:
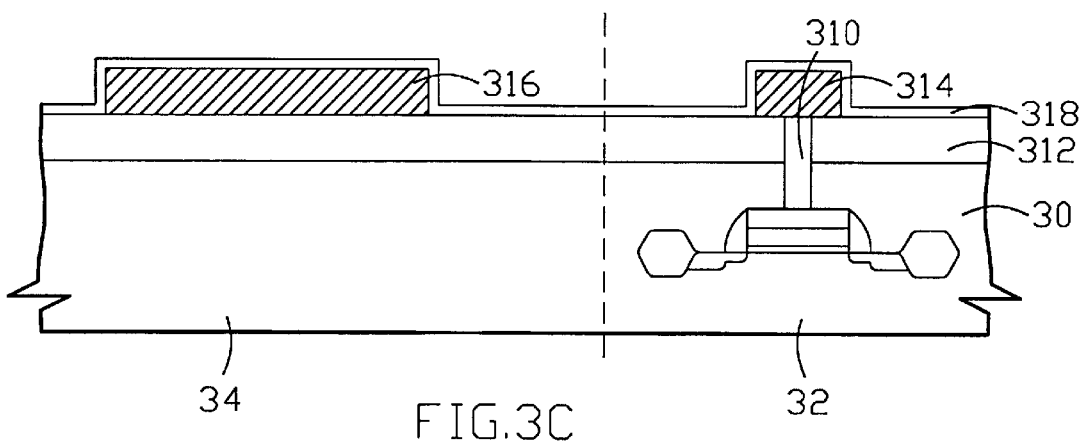
Figure 3D:
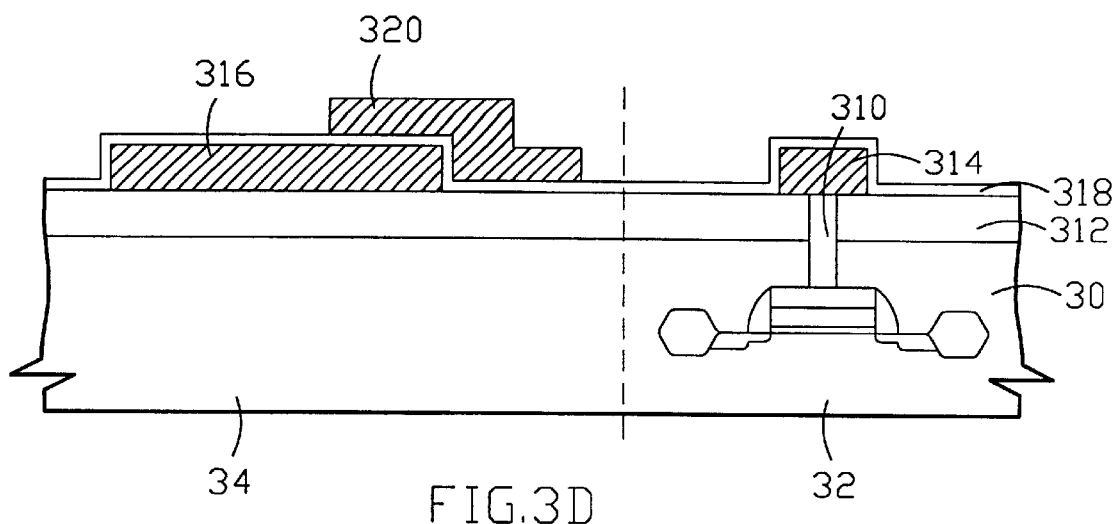
Figure 3E:
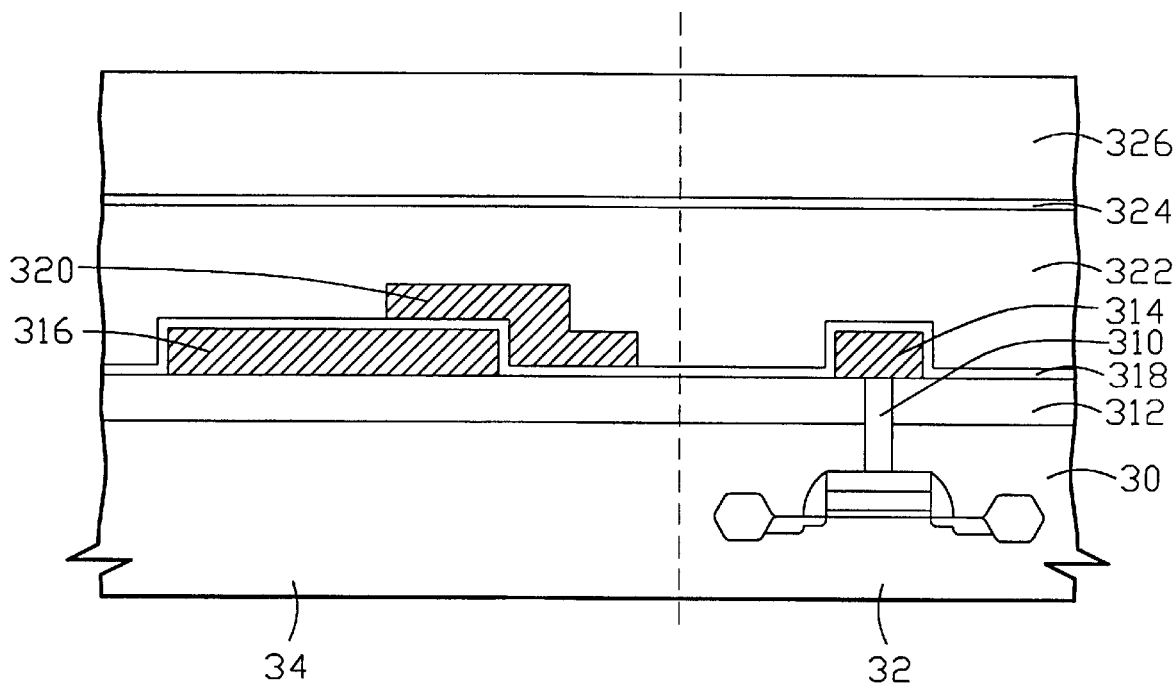

Then, as FIG. 3C, second dielectric layer 318 is formed onto on first metal layer 314 and 316 and semiconductor wafer 30. FIG. 3D shows, second metal layer 320 is deposited on first metal layer 316, cross second oxide layer 318, also is deposited on abutting parts of second oxide layer 318, as the upper electrode of the capacitor. The purpose material for the second metal layer could be aluminium metal. Then, a third dielectric layer 322, silicon nitride 324 and fourth oxide layer 326 are all formed on second metal layer 320 and second oxide layer 318 and semiconductor wafer 30, as FIG. 3E. Third oxide layer 322 is formed using high density plasma (HDP) and plasma enhanced chemical vapor deposition (PECVD), its width is about 7000 angstrom to 10000 angstrom. Silicon nitride 324 is formed by HDP and PECVD, its width is about 200 to 500 angstrom. Fourth oxide layer 326 is formed by HDP and PECVD, its width is about 5000 to 8000 angstrom.

Figure 3F:
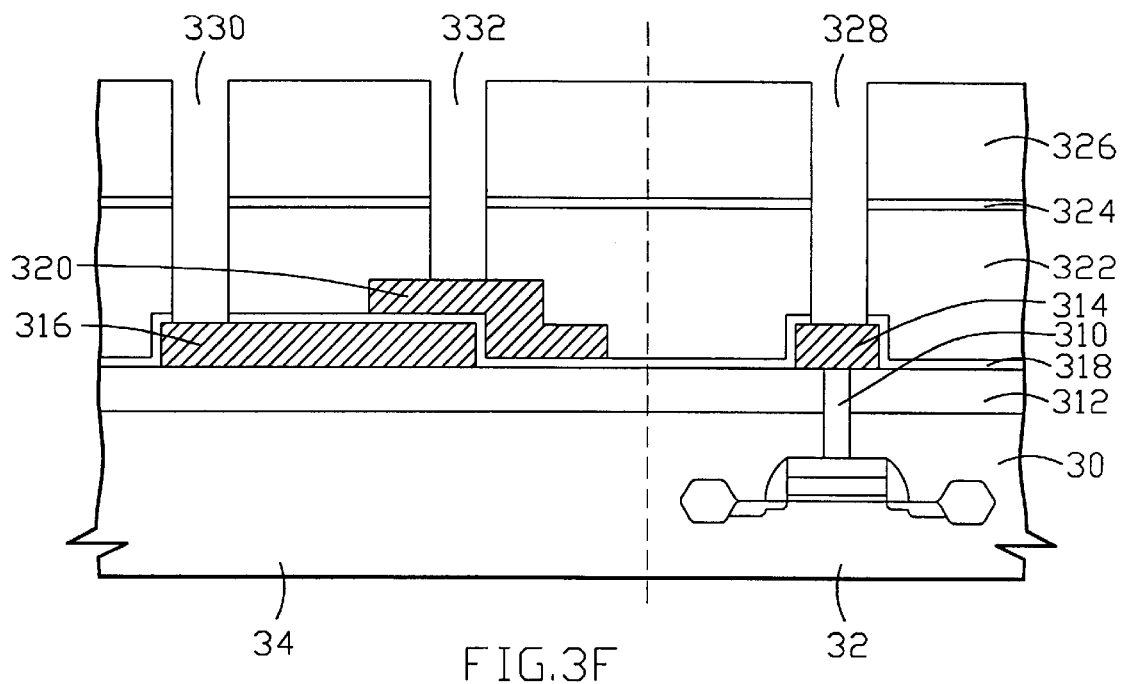
Figure 3G:
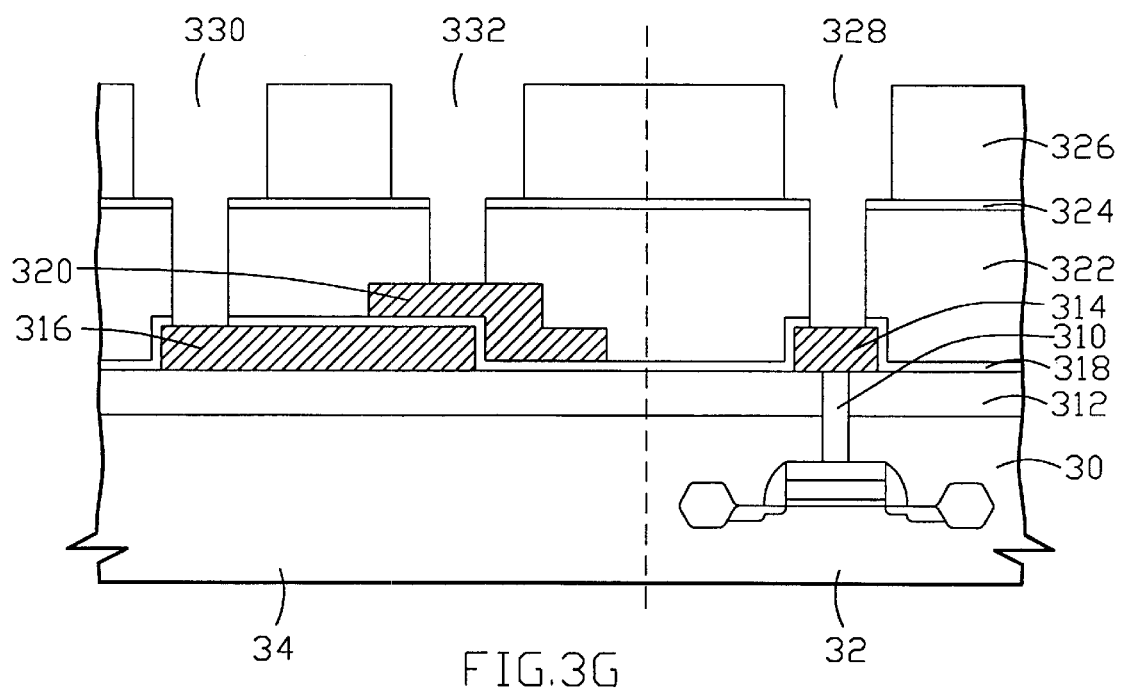

Then, as FIG. 3F, second contact 328, third contact 330 and fourth contact 332 are all etched on first metal layer 314 and 316 and parts of second metal layer 320, and into second oxide layer 318, third oxide layer 322 and silicon nitride 324 and fourth oxide layer 326. The second contact, third contact and fourth contact located on fourth oxide layer 326 are bigger than the second contact, third contact and fourth contact located on fourth oxide layer 322. Tantalum nitride (TaN) film layer 334 is deposited on the two side-wall and bottom of these contacts, as barrier layer for increasing the attachment capability. This thickness of TaN 334 is about 150 to 400 angstrom and is formed by using chemical vapor deposition(CVD), as FIG. 3G.

Figure 3H:
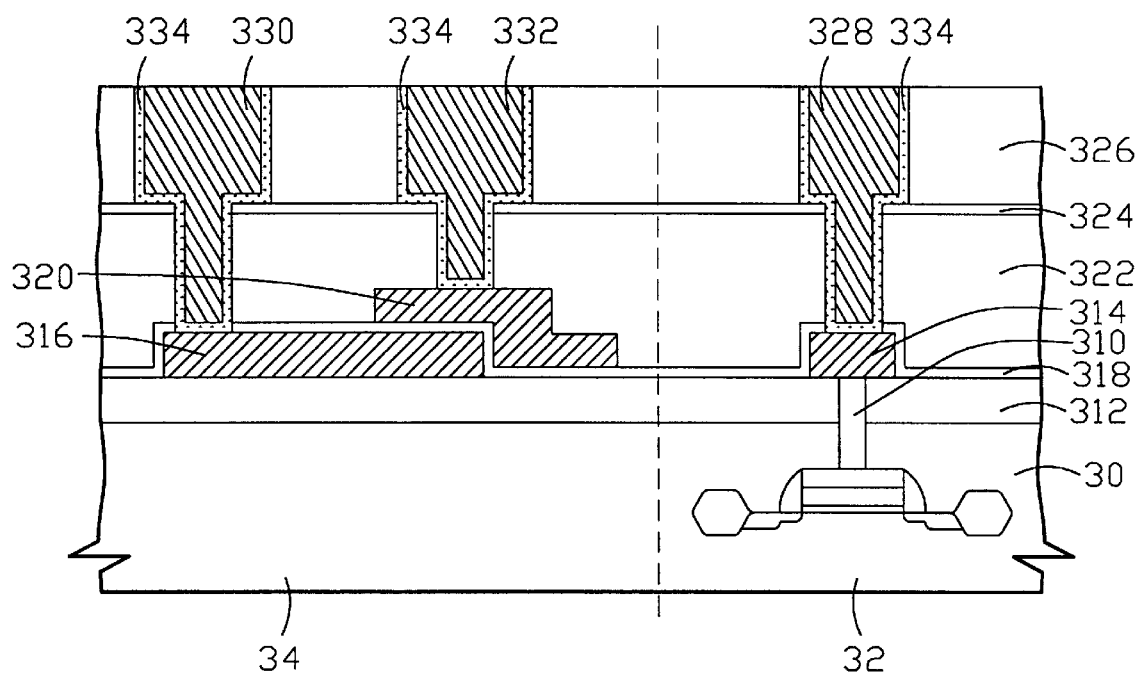

As FIG. 3H, the copper is deposited into second contact 328, third contact 330 and fourth contact 332 by using electro-planting, as the inter-metal line. Then, the inter-metal line is planarized using CMP. Finally, through the outer connection line, the logic circuit 32 and the capacitor circuit 34 can be combined. It is mentioned that the dual damascene process can be applied to the whole process again and again.

Although specific embodiments have been illustrated and described, it will be obvious to those skilled in the art that various modifications may be made without departing from what is intended to be limited solely by the appended claims.

What is claimed is:

1. A method for combining logic circuit and capacitor circuit, comprising:

providing a semiconductor wafer, wherein said semiconductor wafer has a first dielectric layer and a first contact formed in said semiconductor wafer;

forming a first metal layer over said first contact of a logic circuit area, and over a portion of a capacitor circuit area;

forming a second dielectric layer onto on said first metal layer and said first dielectric layer;

forming a second metal layer over a portion of said first metal layer of the capacitor circuit area and abutting on a portion of said second dielectric layer;

forming a third dielectric layer on said second metal layer and said second dielectric layer;

forming a fourth dielectric on said third dielectric layer;

forming a fifth dielectric layer on said fourth dielectric layer;

sequentially etching said fifth dielectric layer, said fourth dielectric layer, said third dielectric layer and said second dielectric layer, whereby forming a second contact which is located on a portion of said first metal layer of the capacitor area, a third contact located on said second metal layer, and a fourth contact which is located on said first metal layer over said first contact;

etching said fifth dielectric layer, whereby said second contact, said third contact, said fourth contact inside said fifth dielectric layer is bigger than said second contact, said third contact and said fourth contact inside said third dielectric layer;

forming a barrier layer on side walls and bottom of said second contact, said third contact and said fourth contact;

forming an inter-metal line into said second contact, said third contact and said fourth contact;

planazing said inter-metal line; and forming outer connection line, whereby combining said logic circuit and said capacitor circuit.

2. The method according to claim 1, wherein said first dielectric layer comprises an oxide layer.

3. The method according to claim 1, wherein said second dielectric layer comprises an oxide layer.

4. The method according to claim 1, wherein said first metal layer comprises aluminium.

5. The method according to claim 1, wherein said second metal layer comprises aluminium.

6. The method according to claim 1, wherein said method for forming said inter-metal line comprises electrical-planting.

7. The method according to claim 1, wherein said third dielectric layer comprises an oxide layer.

8. The method according to claim 7, wherein said method for forming said third dielectric layer comprises high density plasma and plasma enhanced chemical vapor deposition, width is about 7000 to 10000 angstrom.

9. The method according to claim 1, wherein said fourth dielectric layer comprises an oxide layer.

10. The method according to claim 9, wherein said method for forming said fourth layer comprises high density plasma and plasma enhanced chemical vapor deposition, width is about 7000 to 10000 angstrom.

11. The method according to claim 1, wherein said fifth dielectric layer comprises an oxide layer.

12. The method according to claim 11, wherein said method for forming said fifth layer comprises high density plasma and plasma enhanced chemical vapor deposition, width is about 7000 to 10000 angstrom.

13. The method according to claim 1, wherein said barrier layer comprises tantalum nitride.

14. The method according to claim 13, wherein said barrier layer is formed by chemical vapor deposition, width is about 150 angstrom to 400 angstrom.

15. The method according to claim 1, wherein said inter-metal line comprises copper.

16. The method according to claim 15, wherein said method for forming said inter-metal line comprises electrical-planting.

17. A method A method for combining logic circuit and capacitor circuit, comprising:

providing a semiconductor wafer, wherein said semiconductor wafer has a first dielectric layer and a first contact formed in said semiconductor wafer;

forming a first metal layer over said first contact of a logic circuit and over a portion of a capacitor circuit area;

forming a second dielectric layer onto on said first metal layer and said first dielectric layer;

forming a second metal layer over a portion of said first metal layer of the capacitor circuit area, and abutting on a portion of said second dielectric layer;

forming a third dielectric layer on said second metal layer and said second dielectric layer;

forming a fourth dielectric on said third dielectric layer;

forming a fifth dielectric layer on said fourth dielectric layer;

sequentially etching said fifth dielectric layer, said fourth dielectric layer, said third dielectric layer and said second dielectric layer, whereby forming a second contact which is located on a portion of said first metal layer of the capacitor circuit area, a third contact located on said second metal layer, and a fourth contact which is located on said first metal layer over said first contact;

etching said fifth dielectric layer, whereby said second contact, said third contact, said fourth contact inside said fifth dielectric layer is bigger than said second contact, said third contact and said fourth contact inside said third dielectric layer;

forming a barrier layer on side walls and bottom of said second contact, said third contact and said fourth contact;

forming an inter-metal line into said second contact, said third contact and said fourth contact;

planazing said inter-metal line; and forming outer connection line, whereby combining said logic circuit and said capacitor circuit.

18. The method according to claim 17, wherein said method for forming said third oxide layer comprises high density plasma and plasma enhanced chemical vapor deposition, width of said third oxide layer is about 7000 to 10000 angstrom.

19. The method according to claim 17, wherein said method for forming said fourth layer comprises high density plasma and plasma enhanced chemical vapor deposition, width of said fourth layer is about 5000 to 8000 angstrom.

20. The method according to claim 17, wherein said silicon nitride comprises chemical vapor deposition, width of said silicon nitride is about 150 angstrom to 400 angstrom.

21. The method according to claim 17, wherein said first metal layer comprises aluminium.

22. The method according to claim 17, wherein said second metal layer comprises aluminium.

23. The method according to claim 17, wherein said tantalim nitride layer comprises chemical vapor deposition, width of said tantalum nitride layer is about 150 angstrom to 400 angstrom.

24. The method according to claim 17, wherein said method for forming said inter-metal line comprises electrical-planting.

25. The method according to claim 17, wherein said method for forming said inter-metal line comprises chemical mechanical polishing.

* * * * *